United States Patent
Oohiraki et al.

(10) Patent No.: US 10,032,648 B2
(45) Date of Patent: Jul. 24, 2018

(54) METHOD OF MANUFACTURING POWER-MODULE SUBSTRATE WITH HEAT-SINK

(71) Applicant: MITSUBISHI MATERIALS CORPORATION, Tokyo (JP)

(72) Inventors: Tomoya Oohiraki, Kitamoto (JP); Sotaro Oi, Kitamoto (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 15/028,173

(22) PCT Filed: Oct. 8, 2014

(86) PCT No.: PCT/JP2014/076952
§ 371 (c)(1),
(2) Date: Apr. 8, 2016

(87) PCT Pub. No.: WO2015/053316
PCT Pub. Date: Apr. 16, 2015

(65) Prior Publication Data
US 2016/0254209 A1     Sep. 1, 2016

(30) Foreign Application Priority Data

Oct. 10, 2013 (JP) ................. 2013-212871
Jan. 8, 2014 (JP) ................. 2014-001719
Jan. 8, 2014 (JP) ................. 2014-001720

(51) Int. Cl.
*H01L 21/44* (2006.01)
*H01L 21/48* (2006.01)
(Continued)

(52) U.S. Cl.
CPC ...... *H01L 21/4878* (2013.01); *H01L 21/4871* (2013.01); *H01L 21/4882* (2013.01);
(Continued)

(58) Field of Classification Search
CPC . H01L 23/3675; H01L 21/52; H01L 23/3736; H01L 21/4882; H01L 23/3735;
(Continued)

(56) References Cited

U.S. PATENT DOCUMENTS

| 6,033,787 A | 3/2000 | Nagase et al. |
| 2003/0102553 A1* | 6/2003 | Ishikawa ............. H01L 23/3735 257/707 |

(Continued)

FOREIGN PATENT DOCUMENTS

| JP | 07-115252 A | 5/1995 |
| JP | 10-065075 A | 3/1998 |

(Continued)

OTHER PUBLICATIONS

International Search Report dated Jan. 20, 2015, issued for PCT/JP2014/076952.

(Continued)

*Primary Examiner* — Shouxiang Hu
(74) *Attorney, Agent, or Firm* — Locke Lord LLP

(57) ABSTRACT

A maximum length of a heat sink is set as "L" and a warp amount of the heat sink is set as "Z"; the warp amount "Z" is set as a positive value if a bonded surface of the heat sink to a metal layer is deformed to be concave or the warp amount "Z" is set as a negative value if the bonded surface is deformed to be convex; a ratio Z/L of the maximum length "L" and the warp amount "Z" measured at 25° C. is in a range not smaller than −0.005 and not larger than 0.005, and the ratio Z/L is in the range not smaller than −0.005 and not larger than 0.005 even when it is heated to 280° C. and then cooled to 25° C.

3 Claims, 4 Drawing Sheets

(51) Int. Cl.
  *H01L 23/36* (2006.01)
  *H01L 23/473* (2006.01)
  *H01L 23/12* (2006.01)
  *H01L 23/373* (2006.01)
  *H01L 21/52* (2006.01)
  *H01L 23/367* (2006.01)
  *H01L 23/15* (2006.01)

(52) U.S. Cl.
  CPC .............. *H01L 21/52* (2013.01); *H01L 23/12* (2013.01); *H01L 23/36* (2013.01); *H01L 23/3675* (2013.01); *H01L 23/3735* (2013.01); *H01L 23/3736* (2013.01); *H01L 23/473* (2013.01); *H01L 23/15* (2013.01); *H01L 2224/32225* (2013.01); *H01L 2924/3511* (2013.01)

(58) Field of Classification Search
  CPC ....... H01L 21/4878; H01L 2224/32225; H01L 2924/3511; H01L 23/15; H01L 23/473; H01L 23/36; H01L 23/12; H01L 21/4871
  USPC .................................. 257/703, 706; 438/122
  See application file for complete search history.

(56) References Cited

U.S. PATENT DOCUMENTS

2003/0173660 A1    9/2003  Kitamura et al.
2009/0267215 A1*  10/2009  Kitahara ............. H01L 23/3735
                                                           257/691
2013/0010429 A1*   1/2013  Tonomura ........... H01L 23/3735
                                                           361/720
2013/0328184 A1   12/2013  Iwayama et al.
2015/0041187 A1    2/2015  Hori et al.
2015/0055302 A1    2/2015  Nagatomo et al.

FOREIGN PATENT DOCUMENTS

| JP | 10-247763 A | 9/1998 |
| JP | 2000200865 A | 7/2000 |
| JP | 2001313355 A | 11/2001 |
| JP | 2003-273289 A | 9/2003 |
| JP | 2004-047619 A | 2/2004 |
| JP | 2004281676 A | 10/2004 |
| JP | 2005252159 A | 9/2005 |
| JP | 2006-245437 A | 9/2006 |
| JP | 2008-091959 A | 4/2008 |
| JP | 2008-235852 A | 10/2008 |
| JP | 2011035308 A | 2/2011 |
| JP | 2012049437 A | 3/2012 |
| JP | 2013-125779 A | 6/2013 |
| JP | 2013-197246 A | 9/2013 |
| JP | 2013-207237 A | 10/2013 |
| WO | 20120127958 A1 | 9/2012 |
| WO | WO-2013/147124 A1 | 10/2013 |

OTHER PUBLICATIONS

Supplementary European Search Report dated Apr. 5, 2017 issued in corresponding European Patent Application No. 14852005.

* cited by examiner

METHOD OF MANUFACTURING POWER-MODULE SUBSTRATE WITH HEAT-SINK

BACKGROUND OF THE INVENTION

Technical Field

The present invention relates to a power-module substrate with heat-sink and a manufacturing method thereof for a semiconductor device controlling large electric current and high voltage.

Priority is claimed on Japanese Patent Application No. 2013-212871, filed Oct. 10, 2013, and Japanese Patent Application Nos. 2014-1719 and 2014-1720, filed Jan. 8, 2014, the content of which is incorporated herein by reference.

Background Art

As a power module, a power-module substrate with heat-sink is used, in which an aluminum plate is bonded on a ceramic substrate made of aluminum nitride or the like, and an aluminum-based heat sink is bonded on another surface with an aluminum plate therebetween.

Conventionally, the power-module substrate with heat-sink is manufactured as below. First, piling aluminum plates on a first surface and a second surface of a ceramic substrate, with brazing material appropriate for bonding the ceramic substrate and the aluminum plate between the ceramic substrate and the aluminum plates: and while pressing these with a prescribed pressure, heating to temperature or higher for melting the brazing material and then these are cooled. Thus the aluminum plates are bonded on both the surfaces of the ceramic substrate, and the power-module substrate is manufactured.

Next, piling a heat sink on the aluminum plate at the second surface side of the power-module substrate, with brazing material appropriate for bonding the aluminum plate and the heat sink between the aluminum plate and the heat sink: and while pressing these with a prescribed pressure, heating to temperature or higher for melting the brazing material and then these are cooled. Thus the aluminum plate is bonded to the heat sink, and the power-module substrate with heat-sink can be manufactured.

The aluminum plate bonded on the first surface of the power-module substrate with heat-sink is formed into a circuit layer. On this circuit layer, an electronic component such as a power element or the like is mounted by soldering material.

When manufacturing such a power-module substrate with heat-sink, a warp is generated by thermal contraction by cooling after the bonding process since thermal-expansion coefficients are different between members, such as the ceramic substrate and the aluminum plate.

It is disclosed in Patent Document 1 to control a warp amount at high temperature while soldering chips, terminals, heat-radiation plates and the like and a warp amount when a ceramic circuit-substrate is brought back to room temperature so as not to generate warps.

In Patent Document 2, by bonding a circuit metal-plate and a metal radiation-plate with bending a ceramic substrate so as to manufacture a circuit substrate having a warp in which the circuit metal-plate is concavely bent. Generally, a module in which a heat sink and a circuit substrate are bonded is formed by bonding the heat sink so that the module is flat, and used in a state of being bonded to a fixed part. Accordingly, it is disclosed in Patent Document 2 that a generation and growth of cracks can be reduced when it is mounted to the module or under a practical use by forming the concave warp of the circuit metal-plate of the circuit substrate so that compressive stress remains in the circuit substrate when the circuit substrate is fixed flat.

In Patent Document 3, it is described that a warp generated by solder reflowing of a ceramic circuit-substrate and a heat sink is influenced mainly by a volume ratio and a thickness ratio of a metal radiation-plate and a metal circuit-plate; thus it is possible to obtain an appropriate warp-shape in a heating process by setting these structure to an appropriate range.

As above, the warp of the circuit substrate can be reduced by an adjustment of the thicknesses of the heat sink and the aluminum plate on the heat-sink side forming a metal layer with a neutral axis of the ceramic substrate.

CITATION LIST

Patent Document 1: Japanese Unexamined Patent Application, First Publication No. 2003-273289

Patent Document 2: Japanese Unexamined Patent Application, First Publication No. H10-247763

Patent Document 3: Japanese Unexamined Patent Application, First Publication No. 2006-245437

SUMMARY OF INVENTION

Technical Problem

It is required for a power-module substrate to reduce the warp in order to satisfy required specifications of a power module. Even though the warp of the power-module substrate is reduced as described in Patent Document 1, the warp of a power module must be reduced in a state in which electronic components are mounted.

When a power-module substrate with heat-sink in which a power-module substrate and a heat sink are bonded is manufactured, generally, a circuit layer warps convexly, that is to say, a surface of the circuit layer is deformed to be convex. However, it is rather desired for the warp to be convex toward a cooler, that is to say, the deformation to be concave at the surface of the circuit layer than the warp to be concave toward the cooler, that is to say, the warp to be convex at the circuit layer from a point of view to maintain a state in which the power-module substrate with heat-sink and the cooler are in close contact to each other when the power-module substrate with heat-sink and the cooler are fastened with grease or the like therebetween. Also after fastening to the cooler, it is desired to reduce an amount of warp deformation of the power-module substrate with heat-sink in a heat-treating process such as a soldering process of a semiconductor chip or the like.

The present invention is achieved in consideration of the above circumstances, and has an object to provide a power-module substrate with heat-sink and a manufacturing method thereof which can reduce a warp generated in manufacturing the power-module substrate with heat-sink and generation of a warp in a heat-treatment process after manufacturing.

Solution to Problem

A first aspect of the present invention is: a power-module substrate with heat-sink including: a power-module substrate provided with a ceramic substrate, a circuit layer provided on a first surface of the ceramic substrate, and a metal layer made of aluminum of purity not lower than 99% provided on a second surface of the ceramic substrate; and a heat sink bonded to the metal layer of the power-module substrate having a larger yield stress than that of the metal layer, the power-module substrate with heat-sink in which: a maximum length of the heat sink is set as "L" and a warp amount of the heat sink is set as "Z"; the warp amount "Z" is set as a positive value if a bonded surface of the heat sink on the metal layer is deformed to be concave; or is set as a negative value if the bonded surface is deformed to be convex; a ratio Z/L of the maximum length "L" and the warp amount "Z" measured at 25° C. is in a range not smaller than −0.005 and not larger than 0.005, the ratio Z/L is in the range not smaller than −0.005 and not larger than 0.005 even when it is heated to 280° C. and then cooled to 25° C.

Even in a power-module substrate with heat-sink in which the heat sink is made of aluminum alloy having a larger yield stress than that of a metal layer is bonded, if a ratio Z/L is smaller than −0.005 or larger than 0.005 when the temperature is set as above, solder or a semiconductor device may be easy to be misaligned in a process of soldering an electronic component such as the semiconductor device. Moreover, it may occur that the semiconductor device is damaged or reliability of a soldered part and a substrate is deteriorated because of heat cycles.

If the ratio Z/L is in the range not smaller than −0.005 and not larger than 0.005 at the above set temperature, a warp is reduced in manufacturing the power-module substrate with heat-sink, and a warp deformation of the power-module substrate in a heat-treatment process after manufacturing is prevented. Accordingly, it is possible to improve a working property in a soldering process of the semiconductor device and substrate-reliability against a heat-cycle load.

Since the metal layer is made of aluminum of purity 99% or higher and relatively low deformation resistance, it is possible to reduce thermal stress of the ceramic substrate by the heat-cycle load and prevent the ceramic substrate from breaking.

In the power-module substrate with heat-sink according to the present invention, when the temperature is varied from 25° C. to 280° C., it is preferable that a difference ΔZ/L between a maximum value and a minimum value of the ratio Z/L be not larger than 0.005.

The difference ΔZ/L between the maximum value and the minimum value of the ratio Z/L in temperature variation from 25° C. to 280° C. is not larger than 0.005, so that deformation owing to the temperature variation is small. Accordingly, it is possible to further improve the working property in the soldering process of the semiconductor device and the substrate-reliability against the heat-cycle load.

A manufacturing method of the power-module substrate with heat-sink according to the first aspect of the present invention includes: laminating the power-module substrate and the heat sink; heating in a state in which the bonded surface of the heat sink is deformed to concavely warp; and cooling in a deformed state so as to bond the metal layer of the power-module substrate and the heat sink.

When bonding the heat sink and the power-module substrate, the heat sink made of material having the higher yield stress than that of the metal layer of the power-module substrate and the power-module substrate are laminated, held for a prescribed time at temperature higher than the brazing material is melted and then cooled in a state in which the bonded surface of the heat sink on the metal layer of the power-module substrate concavely warps. Accordingly, the brazing material is solidified in a concave shape along the bonded surface of the heat sink, so that the power-module substrate with heat-sink in which the bonded surface of the heat sink concavely warps or a warp amount is small even if it is convex after releasing pressure in a lamination direction can be obtained. In this case, the bonded surface of the heat sink can be concave at bonding-temperature area between the metal layer and the heat sink, i.e., at temperature in which the members expand to a maximal degree.

In the power-module substrate with heat-sink made by this manufacturing method, reducing the warp deformation occurred in manufacturing the power-module substrate with heat-sink, also reducing the warp deformation in the heat-treatment process after manufacturing, it is possible to improve the work property in the device-soldering process and the substrate-reliability against the heat-cycle load. Accordingly, structure flexibility is increased and it is possible to thin size of the power-module.

A second aspect of the present invention is a power-module substrate with heat-sink including: a power-module substrate provide with a ceramic substrate, a circuit layer provided on one surface of the ceramic substrate, and a metal layer made of aluminum of purity not lower than 99% provided on another surface of the ceramic substrate; and a heat sink made of copper or copper alloy having linear-expansion coefficient not smaller than $15 \times 10^{-6}$/K and not larger than $22 \times 10^{-6}$/K and bonded on the metal layer of the power-module substrate, the power-module substrate with heat-sink in which a maximum length of the heat sink is set as "L" and a warp amount of the heat sink is set as "Z"; the warp amount "Z" is set as a positive value if a bonded surface of the heat sink on the metal layer is deformed to be concave; or is set as a negative value if the bonded surface is deformed to be convex; a ratio Z/L of the maximum length "L" and the warp amount "Z" measured at 25° C. is in a range not smaller than −0.015 and not larger than 0.01, and the ratio Z/L is in the range not smaller than −0.015 and not larger than 0.01 even if it is heated to 280° C. and then cooled to 25° C.

In a power-module substrate with heat-sink in which the heat sink made of copper or copper alloy having linear-expansion coefficient not smaller than $15 \times 10^{-6}$/K and not larger than $22 \times 10^{-6}$/K is bonded, if a ratio Z/L is smaller than −0.015 or larger than 0.01 when the temperature is set as above, in a process of soldering electronic components such as a semiconductor device on a circuit layer, solder or semiconductor device may be easy to be misaligned. Moreover, it may occur that the semiconductor device is damaged or reliability of a soldered part and a substrate is deteriorated because of heat cycles.

If the ratio Z/L is in the range not smaller than −0.015 and not larger than 0.01 at the above set temperature, a warp is reduced in manufacturing the power-module substrate with heat-sink, and a warp deformation of the power-module substrate in a heat-treatment process after manufacturing is prevented. Accordingly, it is possible to improve a working property in a soldering process of the semiconductor device and substrate-reliability against a heat-cycle load.

Since the metal layer is made of aluminum of purity not lower than 99%, so that deformation resistance is relatively small, it is possible to reduce thermal stress of the ceramic substrate by the heat-cycle load and prevent the ceramic substrate from breaking.

Moreover, effectiveness of the metal layer having small deformation resistance buffering the stress is improved because the heat sink is made of copper or copper alloy having the lower linear-expansion coefficient than that of aluminum of the metal layer. Furthermore, excellent heat-radiation characteristics can be obtained by characteristics of copper having high thermal conductivity.

In the power-module substrate with heat-sink according to the present invention, when the temperature is varied from 25° C. to 280° C., it is preferable that a difference ΔZ/L between a maximum value and a minimum value of the ratio Z/L be not larger than 0.015.

The difference ΔZ/L between the maximum value and the minimum value of the ratio Z/L in temperature variation from 25° C. to 280° C. is not larger than 0.015, so that deformation owing to the temperature variation is small. Accordingly, it is possible to further improve the working property in the soldering process of the semiconductor device and the substrate-reliability against the heat-cycle load.

A manufacturing method of the power-module substrate with heat-sink according to the second aspect of the present invention includes: laminating the power-module substrate and the heat sink; heating in a state in which the bonded surface of the heat sink is deformed to concavely warp; and cooling in a deformed state so as to bond the metal layer of the power-module substrate and the heat sink.

When bonding the heat sink and the power-module substrate, the power-module substrate and the heat sink made of copper or copper alloy having the linear-expansion coefficient not smaller than $15 \times 10^{-6}$/K and not larger than $22 \times 10^{-6}$/K are laminated, warped so that the bonded surface of the heat sink on the metal layer of the power-module substrate is concave, heated for a prescribed time at temperature lower than eutectic temperature of copper and aluminum, and then cooled. Accordingly, a bonded body in which the bonded surface of the heat sink concavely warps or a warp amount is small even if it is convex after releasing pressure in a lamination direction can be obtained. In this case, the bonded surface of the heat sink can be concave at bonding-temperature area between the metal layer and the heat sink, i.e., at temperature in which the members expand to a maximal degree.

In the power-module substrate with heat-sink made by this manufacturing method, reducing the warp deformation occurred in manufacturing the power-module substrate with heat-sink, also reducing the warp deformation in the heat-treatment process after manufacturing, it is possible to improve the work property in the device-soldering process and the substrate-reliability against the heat-cycle load. Accordingly, structure flexibility is increased and it is possible to thin size of the power-module.

A third aspect of the present invention is: a power-module substrate with heat sink including: a power-module substrate provided with a ceramic substrate, a circuit layer provided on one surface of the ceramic substrate, and a metal layer made of aluminum of purity not lower than 99% provided on another surface of the ceramic substrate; and a heat sink bonded made of material having linear-expansion coefficient not smaller than $7 \times 10^{-6}$/K and not larger than $12 \times 10^{-6}$/K on the metal layer of the power-module substrate, the power-module substrate with heat-sink in which a maximum length of the heat sink is set as "L" and a warp amount of the heat sink is set as "Z"; the warp amount "Z" is set as a positive value if a bonded surface of the heat sink on the metal layer is deformed to be concave, or is set as a negative value if the bonded surface is deformed to be convex; a ratio Z/L of the maximum length "L" and the warp amount "Z" measured at 25° C. is in a range not smaller than −0.002 and not larger than 0.002, and the ratio Z/L is in the range not smaller than −0.002 and not larger than 0.002 even when it is heated to 280° and then cooled to 25° C.

Even in a power-module substrate with heat-sink in which the heat sink made of material having the linear-expansion coefficient not smaller than $7 \times 10^{-6}$/K and not larger than $12 \times 10^{-6}$/K is bonded, if a ratio Z/L is smaller than −0.002 or larger than 0.002 when the temperature is set as above, solder or a semiconductor device may be easy to be misaligned in a process of soldering electronic components such as the semiconductor device on the circuit layer. Moreover, it may occur that the semiconductor device is damaged or reliability of a soldered part and a substrate is deteriorated because of heat cycles.

If the ratio Z/L is in the range not smaller than −0.002 and not larger than 0.002 at the above set temperature, a warp is reduced in manufacturing the power-module substrate with heat-sink, and a warp deformation of the power-module substrate in a heat-treatment process after manufacturing is prevented. Accordingly, it is possible to improve a working property in a soldering process of the semiconductor device and substrate-reliability against a heat-cycle load.

Since the metal layer is made of aluminum of purity not lower than 99%, so that deformation resistance is relatively small, it is possible to reduce thermal stress of the ceramic substrate by the heat-cycle load and prevent the ceramic substrate from breaking.

Moreover, effectiveness of the metal layer having small deformation resistance buffering the stress is improved because the heat sink is made of low thermal-expansion material having the linear-expansion coefficient not smaller than $7 \times 10^{-6}$/K and not larger than $12 \times 10^{-6}$/K.

As the material having the linear-expansion coefficient not smaller than $7 \times 10^{-6}$/K and not larger than $12 \times 10^{-6}$/K for forming the heat sink, AlSiC matrix composite material, Al graphite composite material, Cu—W alloy, or Cu—Mo alloy can be used.

For example, AlSiC matrix composite material is a composite of aluminum and silicon carbide, made by impregnating porous medium including mainly silicon carbide (SiC) with metal including aluminum (Al) as an ingredient, and has both a low thermal-expansion property of silicon carbide and a high thermal-conductivity of aluminum.

Al graphite composite material is made by impregnating carbonaceous member (graphite) with aluminum (Al), as similar as AlSiC matrix composite material, is material having low thermal-expansion and high thermal-conductivity. Cu—W alloy is material having both properties of tungsten (W) having low thermal-expansion property and copper (Cu) having high thermal-conductivity. Cu—Mo alloy is material in which linear-expansion coefficient and thermal-conductivity are variable in accordance with a molybdenum (Mo) content.

As above, by forming the heat sink from material with low thermal-expansion property and high thermal-conductivity, it is possible to buffer the thermal stress and obtain excellent heat-radiation property.

In the power-module substrate with heat-sink according to the present invention, when the temperature is varied from 25° C. to 280° C., it is preferable that a difference ΔZ/L between a maximum value and a minimum value of the ratio Z/L be not larger than 0.002.

The difference ΔZ/L between the maximum value and the minimum value of the ratio Z/L in temperature variation from 25° C. to 280° C. is not larger than 0.002, so that deformation owing to the temperature variation is small. Accordingly, it is possible to further improve the working property in the soldering process of the semiconductor device and the substrate-reliability against the heat-cycle load.

A manufacturing method of the power-module substrate with heat-sink according to the third aspect of the present invention includes: laminating the power-module substrate and the heat sink; heating in a state in which the bonded surface of the heat sink is deformed to concavely warp; and cooling in a deformed state so as to bond the power-module substrate and the heat sink.

In this manufacturing method, in a case in which the heat sink and the power-module substrate are bonded by brazing for example, the heat sink made of low thermal-expansion material and the power-module substrate are laminated, bent so that the bonded surface of the heat sink on the metal layer of the power-module substrate concavely warps, held for a prescribed time at temperature higher than the brazing material is melted, and then cooled. Accordingly, the brazing material is solidified in a concave shape along the bonded surface of the heat sink, so that a bonded body in which the bonded surface of the heat sink concavely warps or a warp amount is small even if it is convex after releasing pressure in a lamination direction can be obtained. In this case, the bonded surface of the heat sink can be concave at bonding-temperature area between the metal layer and the heat sink, i.e., at temperature in which the members expand to a maximal degree.

In the power-module substrate with heat-sink made by this manufacturing method, reducing the warp deformation occurred in manufacturing the power-module substrate with heat-sink, also reducing the warp deformation in the heat-treatment process after manufacturing, it is possible to improve the work property in the device-soldering process and the substrate-reliability against the heat-cycle load. Accordingly, structure flexibility is increased and it is possible to thin size of the power-module.

Advantageous Effects of Invention

According to the present invention, it is possible to reduce the warp generated in manufacturing the power-module substrate with heat-sink and generation of the warp in the heat-treatment process after manufacturing.

DESCRIPTION OF EMBODIMENTS

Figure 1:
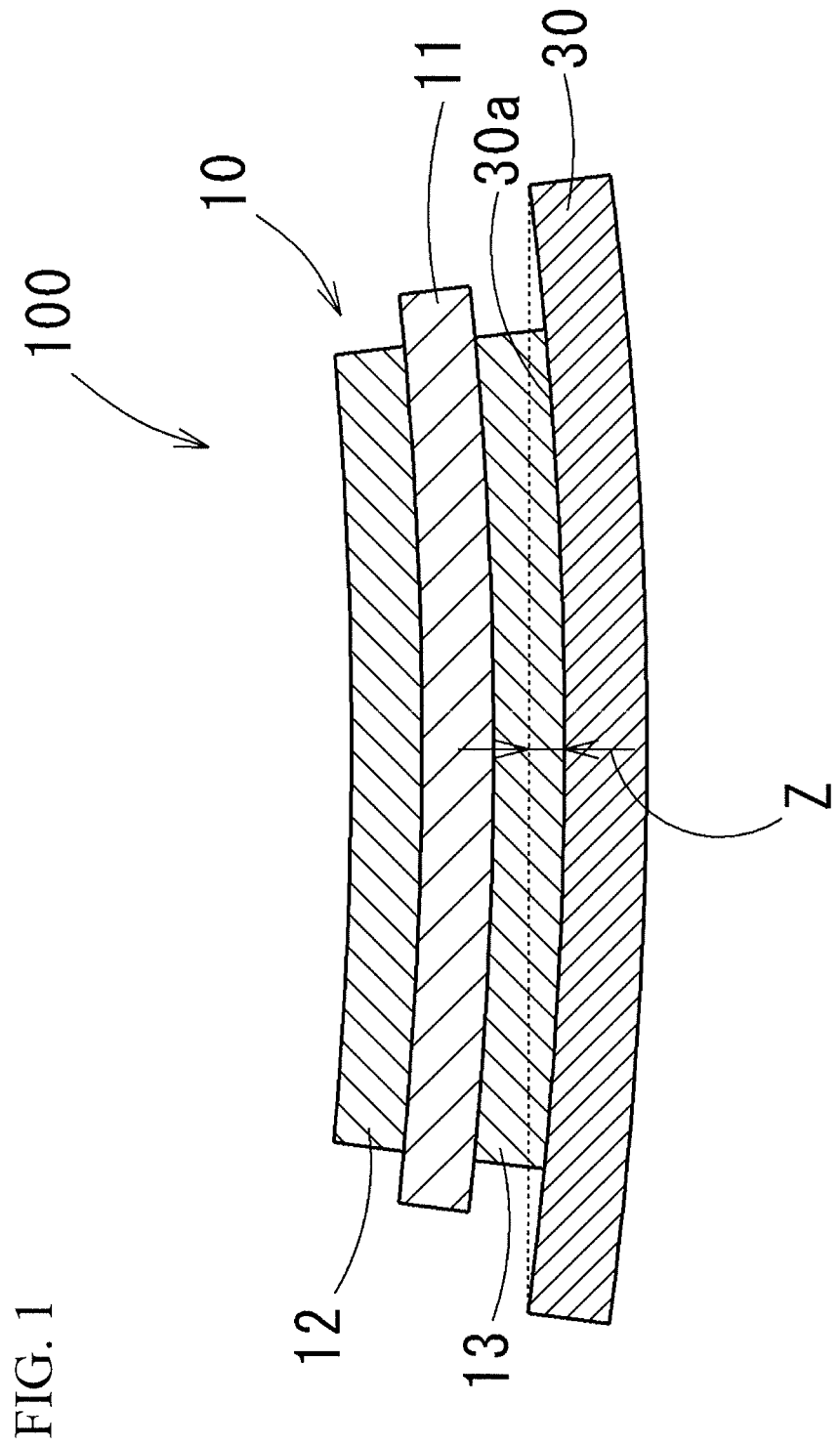
FIG. 1 is a cross-sectional view showing a power-module substrate with heat-sink according to the present invention.

Below, a first embodiment according to a first aspect of the present invention will be described referring to drawings. FIG. 1 shows a power-module substrate with heat-sink 100 of the present embodiment. The power-module substrate with heat-sink 100 is structured from a power-module substrate 10 and a heat sink 30 bonded to the power-module substrate 10.

Figure 2:
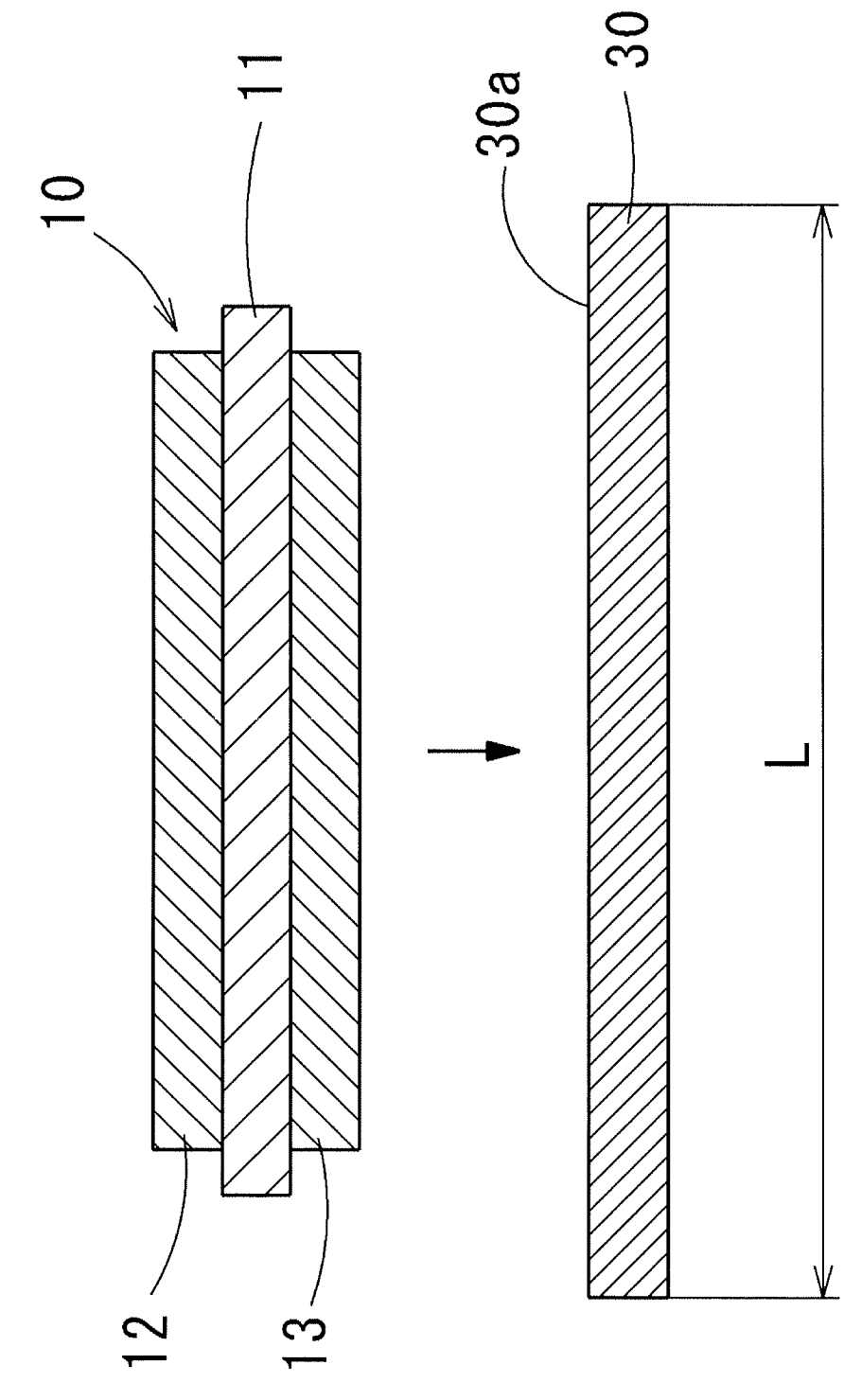
FIG. 2 is a cross-sectional view explaining a bonding process of a heat sink and a power-module substrate in a manufacturing method according to the present invention.

In the power-module substrate with heat-sink 100 is provided with, as shown in FIG. 1 and FIG. 2, the power-module substrate 10 in which a circuit layer 12 is disposed on one surface of a ceramic substrate 11 and a metal layer 13 made of aluminum of purity 99% or higher is disposed on another surface and the heat sink 30 bonded on the metal layer 13 of the power-module substrate 10.

In the power-module substrate with heat-sink 100, a maximum length of the heat sink 30 is set as "L", a warp amount of the heat sink 30 is set as "Z", the warp amount "Z" is set as a positive value if a bonded surface 30a of the heat sink 30 on the metal layer 13 is deformed to be concave (i.e., deformation of a surface of the circuit layer 12 being concavely warped) or the warp amount "Z" is set as a negative value if the bonded surface 30a is deformed to be convex (i.e., deformation of the surface of the circuit layer 12 being convexly warped). In this power-module substrate with heat-sink 100, a ratio Z/L of the maximum length L and the warp amount Z at 25° C. is not smaller than −0.005 and not larger than 0.005, and the ratio Z/L is in the range not smaller than −0.005 and not larger than 0.005 even when it is heated to 280° C. and then cooled to 25° C. Detail of the ratio Z/L will be described below.

Figure 3:
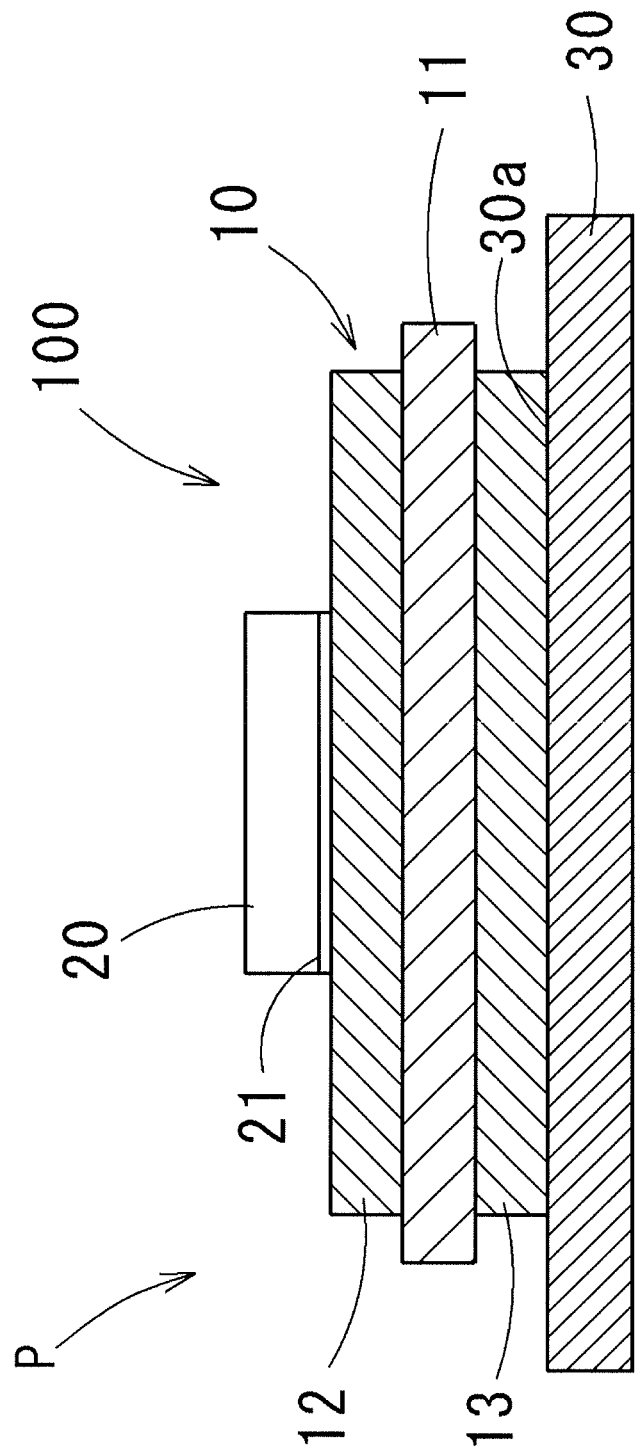
FIG. 3 is a cross-sectional view showing an embodiment of a power module using the power-module substrate with heat-sink according to the present invention.

As shown in FIG. 3, a power module P is manufactured by mounting an electronic component 20 such as a semiconductor chip or the like on a surface of the power-module substrate 10 in the power-module substrate with heat-sink 100.

In a manufacturing process of the power-module substrate with heat-sink 100, the power-module substrate 10 is produced first, and then a top plate of the heat sink 30 is brazed on the power-module substrate 10. Below, the heat sink 30 is illustrated only by the top plate (a heat-radiation plate) which is bonded on the metal layer 13 and described.

The power-module substrate 10 is provided with the ceramic substrate 11, and the circuit layer 12 and the metal layer 13 which are laminated on the ceramic substrate 11. The electronic component 20 is soldered on the surface of the circuit layer 12 of the power-module substrate 10. The heat sink 30 is installed on a surface of the metal layer 13.

The ceramic substrate 11 is made of, for example, nitride ceramics as AlN (aluminum nitride), $Si_3N_4$ (silicon nitride), or oxide ceramics as $Al_2O_3$ (alumina) into thickness 0.2 to 1.5 mm, or preferably thickness 0.635 mm.

The circuit layer 12 is made of aluminum of purity 99 mass % or higher, more specifically, aluminum at a level of No. 1000 by JIS standard, especially 1N90 (99.9 mass % or higher purity: the so-called 3N aluminum) or 1N99 (99.99 mass % or higher purity: the so-called 4N aluminum). Furthermore, it is possible to use aluminum alloy, copper or copper alloy in addition to aluminum.

The metal layer 13 is made of aluminum of purity 99 mass % or higher, more specifically, aluminum at a level of No. 1000 by JIS standard, especially 1N99 (99.99 mass % or higher purity: the so-called 4N aluminum).

The circuit layer 12 and the metal layer 13 are made from aluminum plates of rolled sheets of aluminum of purity 99.99 mass % or higher (the so-called 4N aluminum), and set to have thickness 0.2 mm to 3.0 mm. Preferably, the thickness of the circuit layer 12 be 0.6 mm; and the thickness of the metal layer be 2.1 mm.

The circuit layer 12 and the metal layer 13 are bonded to the ceramic substrate 11, for example, by brazing. As brazing material, alloys as Al—Si based, Al—Ge based, Al—Cu based, Al—Mg based, or Al—Mn based are used.

The electronic component 20 forming the power module P is bonded on a Ni plating (not illustrated) formed on the surface of the circuit layer 12 by soldering material of Sn—Ag—Cu based, Zn—Al based, Sn—Ag based, Sn—Cu based, Sn—Sb based, Pb—Sn based or the like. The reference number 21 in FIG. 3 denotes the soldering layer. The electronic component 20 and a terminal of the circuit layer 12 are connected by a bonding wire (not illustrated) made of aluminum.

In the present embodiment, the heat sink 30 bonded on the power-module substrate 10 is made of aluminum alloy having higher yield stress than that of the metal layer 13. For example, A3003, A5052, A6063, A7075 or the like can be used, especially aluminum alloy of A6063 is suitable for the heat sink 30. In a case in which the metal layer 13 is made of 4N aluminum, A1050 alloy or the like is suitable for the heat sink 30.

Metal members for reducing temperature by radiation of heat, such as a plate-shape heat-radiation plate (i.e., a top plate), a cooler in which coolant flows therein, a liquid-cooling/air-cooling radiator in which fins are made, a heat pipe and the like are included in the heat sink 30.

A manufacturing method of the power-module substrate with heat-sink 100 will be described. First, rolled sheets made of pure aluminum having 99.99 mass % or higher are prepared for the circuit layer 12 and the metal layer 13. These pure aluminum rolled sheets are piled respectively on one surface and the other surface of the ceramic substrate 11 with brazing material, pressurized and heated so as to manufacture the power-module substrate 10 in which the pure aluminum rolled sheets are bonded on one surface and the other surface of the ceramic substrate 11 by brazing. Brazing temperature is set to 600° C. to 655° C.

Figure 4:
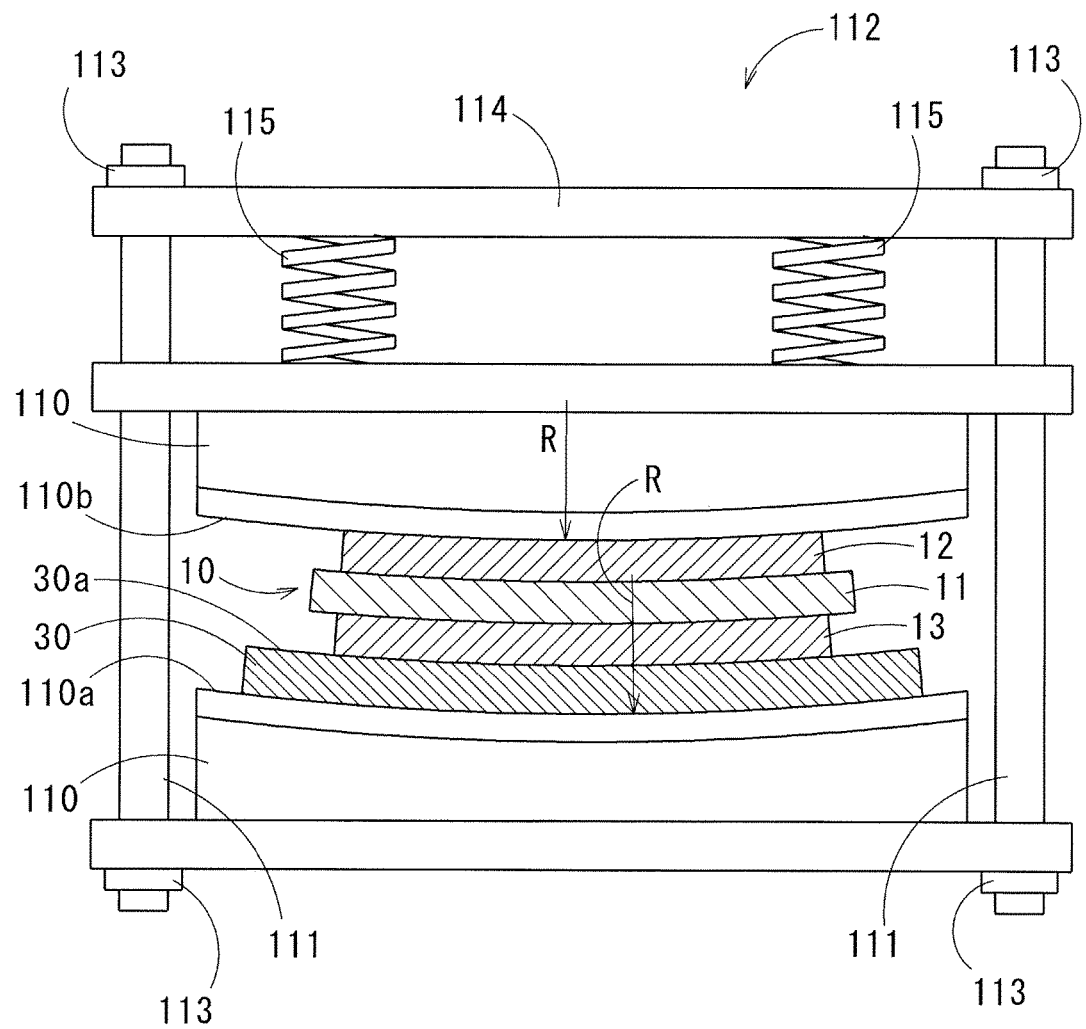
FIG. 4 is a cross-sectional view showing a state in which a laminated body of the heat sink and the power-module substrate are installed in a pressing device in a manufacturing method according to the present invention.

Next, in order to bond the heat sink 30 to the power-module substrate 10 as formed above: first, using a tool (a pressing device) 112 formed with two pressing plates 110 and posts 111 provided at four corners of the pressing plates 110, the heat sink 30 and the power-module substrate 10 are disposed between the pressing plate 110 as shown in FIG. 4.

The two pressing plates 110 of the tool 112 are made by piling carbon plates on surfaces of stainless-steel members, have respective surfaces 110a and 110b facing to each other. The surfaces 110a and 110b of the pressing plates 110 are formed as a concave or convex surface with a curvature radius R not smaller than 1000 mm and not larger than 6000 mm so that the bonded surface 30a of the heat sink 30 on the power-module substrate 10 is concavely warped. In other words, between the concave surface 110a and the convex surface 110b of the pressing plates 110 facing to each other, the power-module substrate 10 and the heat sink 30 are disposed in a state in which the heat sink 30 is in contact to the concave surface 110a. Since the curvature radius R of the concave surface 110a and the convex surface 110b is not smaller than 1000 mm and not larger than 6000 mm, the warp generated by manufacturing the power-module substrate with heat-sink 100 is reduced, and it is possible to prevent warp-deformation of the power module P by a heat-treatment process of manufacturing the power module P.

Screw threads are made at both ends of the posts 111 of the tool 112. Nuts 113 are fitted to the screw threads so that the pressing plates 110 are arranged between the nuts 113. Between a top plate 114 held by the post 111 and the pressing plate 110, a pressing device 115 such as a spring or the like is arranged so as to press the pressing plate 110 downwardly. A pressing force on the power-module substrate 10 and the heat sink 30 is controlled by fastening of the pressing device 115 and the nuts 113.

In the manufacturing process of the power-module substrate with heat-sink, by installing the power-module substrate 10 and the heat sink 30 to the tool 112, it is possible to reduce a warp of the power-module substrate with heat-sink 100.

First, the heat sink 30 is arranged on the concave surface 110a of the lower pressing plate 110; the power-module substrate 10 is piled on the heat sink 30 with an Al—Si based brazing foil (not illustrated) therebetween; so that a piled body of the heat sink 30 and the power-module substrate 10 is sandwiched between the pressing plate 110 having the concave surface 110a and the pressing plate 110 having the convex surface 110b. The piled body of the heat sink 30 and the power-module substrate 10 is pressed in a thickness direction by the concave surface 110a and the convex surface 110b of the pressing plates 110 and deformed so that the bonded surface 30a of the heat sink 30 concavely warps. Then, the piled body of the heat sink 30 and the power-module substrate 10 is brazed by heating in a pressing state in the present embodiment.

The brazing is performed in vacuum atmosphere, by load of 0.3 MPa to 10 MPa and at heating temperature of 550° C. to 650° C.

Next, a bonded body of the heat sink 30 and the power-module substrate 10 is cooled to normal temperature (25° C.) in a state of being installed on the tool 112, i.e., in a state of fixing the deformation.

At this time, the bonded body of the heat sink 30 and the power-module substrate 10 is pressed in the thickness direction by the tool 112 and fixed in the deformed state in which the bonded surface 30a of the heat sink 30 concavely warps. Accordingly, a shape of the bonded body does not appear to be changed even while heating and cooling. However, as a result of pressing and fixing against the deformation of members by difference of thermal-expansion along with temperature variation, plastic deformation is generated in the metal layer 13 and the heat sink 30. That is to say, the metal layer 13 and the heat sink 30 are bonded in a state of being deformed. Furthermore, since it is fixed when being cooled, the deformed state is maintained.

The power-module substrate with heat-sink 100 manufactured as above is prevented from warping since the heat sink 30 is made of material having higher yield stress than that of the metal layer 13. Setting a maximum length of the heat sink 30 as "L", a warp amount of the heat sink 30 as "Z", and the warp amount "Z" as a positive value if the heat sink 30 is convex toward the bonded surface 30a (concave deformation at the bonded surface 30a of the heat sink 30), a ratio Z/L of the maximum length "L" and the warp amount "Z" at 25° C. in this power-module substrate with heat-sink 100 is in a range not smaller than −0.005 and not larger than 0.005. Furthermore, the ratio Z/L is in the range not smaller than −0.005 and not larger than 0.005 when heating to 280° C.; and then cooling to 25° C., the ratio Z/L is in the range not smaller than −0.005 and not larger than 0.005.

If the ratio Z/L is smaller than −0.005 or larger than 0.005 at the above temperature, positions of solder and the semiconductor device are easily shifted in a soldering process of soldering the electronic component 20 such as the semiconductor device on the circuit layer 12. Moreover, it is liable to break the semiconductor device and bring deterioration of reliability of the solder-bonded part and the substrate because of the heat cycle.

If the ratio Z/L is in the range not smaller than −0.005 and not larger than 0.005 at the above temperature, the power-module substrate with heat-sink 100 is prevented from warping in manufacturing, so that warp deformation of the power module P in the heat-treatment process after manufacturing is prevented. Accordingly, it is possible to improve working property in the soldering process of the electronic component 20 such as the semiconductor device and the like and reliability of the substrate against the heat-cycle load.

As described above, according to the manufacturing method of the present embodiment, when the heat sink 30 and the power-module substrate 10 are bonded, forming the heat sink 30 from material having higher yield stress than that of the metal layer 13, making the laminated body of the heat sink 30 and the power-module substrate 10 to a warped state in which an opposite side to the heat sink 30 is upper and concave in the laminating direction (a state in which the bonded surface 30a of the heat sink 30 and the surface of the circuit layer 12 are concave), holding the laminated body for a prescribed time at temperature higher than melting the brazing material (in a bonding-temperature area of the brazing material) and then cooling it so as to solidify the brazing material in the concavely warped state: the bonded body concavely warps in a state in which the circuit layer 12 is upper or slightly convexly warps even after releasing the pressing state in the thickness direction (i.e., the laminating direction). Therefore, in the bonding-temperature area of the brazing material, it is possible to generate the concave deformation in a state in which the members are expanded at the maximum. That is to say, even when the cooler is installed or even in the heat-treatment process of soldering the semiconductor device and the like after manufacturing, the power-module substrate with heat-sink 100 can be obtained in the state of the bonded surface 30a is maintained to be concave (i.e., the circuit surface is concave). In addition, in the power-module substrate with heat-sink of the present embodiment, the warp amount changes linearly in temperature area of 25° C. to 280° C.

In the power-module substrate with heat-sink 100 as manufactured above: the warp deformation generated in manufacturing can be reduced; the warp deformation in the heat-treatment process after manufacturing can be reduced; the working property in the soldering process of the semiconductor device can be improved; and the substrate reliability against the heat-cycle load can be improved. Accordingly, it is possible to structure more freely and reduce the whole size of the power module.

Next, a second embodiment of the present invention will be described referring to drawings: since a structure thereof is similar to that of the power-module substrate with heat-sink 100 of the first embodiment, the members are denoted by the same reference symbols and description similar to the first embodiment will be omitted. The present embodiment differs from the first embodiment in a point in which a heat sink 30 is made of copper or copper alloy having linear-expansion coefficient not lower than $15 \times 10^{-6}$/K and not higher than $22 \times 10^{-6}$/K.

In a power-module substrate with heat-sink 100 of the present embodiment, as shown in FIG. 1 and FIG. 2: the heat sink 30 is made of copper or copper alloy having linear-expansion coefficient not lower than $15 \times 10^{-6}$/K and not higher than $22 \times 10^{-6}$/K; a maximum length of the heat sink 30 is set as "L"; a warp amount of the heat sink 30 is set as "Z"; the warp amount "Z" is set as a positive value if a bonded surface 30a of the heat sink 30 on the metal layer 13 is concavely deformed (that is, deformation in which the surface of the circuit layer 12 is concave and the surface of the metal layer 13 is convex); the warp amount "Z" is set as a negative value if the bonded surface 30a is convexly deformed (that is, deformation in which the surface of the circuit layer 12 is convex and the surface of the metal layer 13 is concave); a ratio Z/L of the maximum length "L" and the warp amount Z" is not smaller than −0.015 and not larger than 0.01 at 25° C.; and the ratio Z/L is in a range not smaller than −0.015 and not larger than 0.01 when heated to 280° C. and then cooled to 25° C.

The heat sink 30 bonded to the power-module substrate 10 of the present embodiment is made of copper or copper alloy having lower linear-expansion coefficient than that of the metal layer 13, not lower than $15 \times 10^{-6}$/K and not higher than $22 \times 10^{-6}$/K, for example, C1100 alloy, C1020 alloy or the like, especially C1020 alloy (having linear-expansion coefficient of $17.7 \times 10^{-6}$/K) is suitable.

A manufacturing method of the power-module substrate with heat-sink 100 in the present embodiment will be described. Processes of manufacturing the power-module substrate 10 by bonding the circuit layer 12 and the metal layer 13 to the ceramic substrate 11 is the same as that of the first embodiment, so the description will be omitted here.

Also in the manufacturing process of the power-module substrate with heat-sink 10 of the present embodiment, the power-module substrate with heat-sink 100 is prevented from warping similar to the first embodiment, by installing the power-module substrate 10 and the heat sink 30 on the tool 112.

In the present embodiment, while pressing a piled body of the heat sink 30 and the power-module substrate 10 in a state in which the power-module substrate 10 and the heat sink 30 are installed on the tool 112 similar to the first embodiment, the heat sink 30 and the metal layer 13 of the power-module substrate 10 are fixed by solid-phase diffusion-welding by heating at temperature lower than eutectic temperature of copper and aluminum.

In the present embodiment, the heat sink 30 and the metal layer 13 of the power-module substrate 10 are bonded by solid-phase diffusion forming a diffusion layer (not illustrated) by mutual diffusion of aluminum atom of the metal layer 13 and the copper atom of the heat sink 30. The solid-phase diffusion-welding is performed by holding in vacuum atmosphere, by load of 0.3 MPa to 10 MPa, at heating temperature not lower than 400° C. and not higher than 548° C., for 5 minutes to 240 minutes.

Next, a bonded body of the heat sink 30 and the power-module substrate 10 is cooled to normal temperature (25° C.) in a state of being installed on the tool 112, that is to say, in a state of fixing the deformation.

At this time, the bonded body of the heat sink 30 and the power-module substrate 10 is pressed in the thickness direction by the tool 112 and fixed in the deformed state in which the bonded surface 30a of the heat sink 30 concavely warps. Accordingly, a shape of the bonded body does not appear to be changed even while heating and cooling. However, as a result of pressing and fixing against the deformation of members by difference of thermal-expansion along with temperature variation, plastic deformation is generated in the metal layer 13 and the heat sink 30. That is to say, the metal layer 13 and the heat sink 30 are bonded in a state of being deformed. Furthermore, since it is fixed when being cooled, the deformed state is maintained.

The power-module substrate with heat-sink 100 of the present embodiment manufactured by the similar process to the first embodiment as above is prevented from warping since the heat sink 30 is made of material having lower linear-expansion coefficient than that of the metal layer 13. The ratio Z/L of the maximum length "L" and the warp amount "Z" of the power-module substrate with heat-sink 100 is not smaller than −0.015 and not larger than 0.01 at 25° C. Furthermore, the ratio Z/L is in the range not smaller than −0.015 and not larger than 0.01 when heating to 280° C. and then cooling to 25° C.

If the ratio Z/L is smaller than −0.015 or larger than 0.01 at the above temperature, positions of solder and the semiconductor device are easily shifted in a soldering process of soldering the electronic component 20 such as the semiconductor device on the circuit layer 12. Moreover, it is liable to break the semiconductor device and bring deterioration of reliability of the solder-bonded part and the substrate because of the heat cycle.

If the ratio Z/L is in the range not smaller than −0.015 and not larger than 0.01 at the above temperature, the power-module substrate with heat-sink 100 is prevented from warping in manufacturing, and warp deformation of the power module in the heat-treatment process after manufacturing is prevented. Accordingly, it is possible to improve working property in the soldering process of the electronic component 20 such as the semiconductor device and the like and reliability of the substrate against the heat-cycle load.

As described above, according to the manufacturing method of the present embodiment, forming the heat sink 30 from material of lower thermal-expansion than that of the metal layer 13, when the heat sink 30 an the power-module substrate 10 are bonded, making the laminated body of the heat sink 30 and the power-module substrate 10 to a warped state in which an opposite side to the heat sink 30 is upper and concave in the laminating direction (a state in which the bonded surface 30$a$ of the heat sink 30 and the surface of the circuit layer 12 are concave), holding the laminated body for a prescribed time at a bonding-temperature area (in a bonding-temperature area of the solid-phase diffusion) and then cooling it: the bonded body concavely warps in a state in which the circuit layer 12 is upper or slightly convexly warps even after releasing the pressing state along the thickness direction (i.e., the laminating direction). Therefore, in the bonding-temperature area of the solid-phase diffusion, it is possible to generate the concave deformation in a state in which the members are expanded at the maximum. That is to say, even when the cooler is installed or even in the heat-treatment process of soldering the semiconductor device and the like after manufacturing, the power-module substrate with heat-sink 100 can be obtained in the state of the bonded surface 30$a$ is maintained to be concave (i.e., the circuit surface is concave). In addition, in the power-module substrate with heat-sink of the present invention, the warp amount changes linearly in temperature area of 25° C. to 280° C.

In the power-module substrate with heat-sink 100 as manufactured above: the warp deformation generated in manufacturing can be reduced; the warp deformation in the heat-treatment process after manufacturing can be reduced; the working property in the soldering process of the semiconductor device can be improved; and the substrate reliability against the heat-cycle load can be improved. Accordingly, it is possible to structure more freely and reduce the whole size of the power module.

In addition, in the power-module substrate with heat-sink of the present embodiment, since the metal layer 13 is made of aluminum of 99% or higher purity having relatively low deformation resistance, it is possible to reduce thermal stress in a ceramic substrate generated by heat-cycle load, so that the ceramic substrate is prevented from breaking.

Effect of reducing stress by the small deformation resistance of the metal layer 13 is further improved because the heat sink 30 is made of copper or copper alloy having lower linear-expansion coefficient (not lower than $15 \times 10^{-6}$/K and not higher than $22 \times 10^{-6}$/K than that of the metal layer 13.

Next, a third embodiment of the present invention will be described with referring to drawings: since a structure thereof is similar to that of the power-module substrate with heat-sink 100 of the first embodiment and the second embodiment, the members are denoted by the same reference symbols and description similar to the above-mentioned embodiments will be omitted. The present embodiment differs from the above-mentioned embodiments in a point in which a heat sink 30 is made of material having linear-expansion coefficient not lower than $7 \times 10^{-6}$/K and not higher than $12 \times 10^{-6}$/K.

In a power-module substrate with heat-sink 100 of the present embodiment, as shown in FIG. 1 and FIG. 2: the heat sink 30 is made of material having linear-expansion coefficient not lower than $7 \times 10^{-6}$/K and not higher than $12 \times 10^{-6}$/K; a maximum length of the heat sink 30 is set as "L"; a warp amount of the heat sink is set as "Z"; the warp amount "Z" is set as a positive value if a bonded surface 30$a$ of the heat sink 30 on the metal layer 13 is concavely deformed (that is, deformation in which the surface of the circuit layer 12 is concave and the surface of the metal layer 13 is convex); the warp amount "Z" is set as a negative value if the bonded surface 30$a$ is convexly deformed (that is, deformation in which the surface of the circuit layer 12 is convex and the surface of the metal layer 13 is concave); a ratio Z/L of the maximum length "L" and the warp amount Z" is not smaller than −0.002 and not larger than 0.002 at 25° C.: and the ratio Z/L is in a range not smaller than −0.002 and not larger than 0.002 when heated to 280° C. and then cooled to 25° C.

The heat sink 30 bonded to the power-module substrate 10 of the present embodiment is made of material having linear-expansion coefficient not lower than $7 \times 10^{-6}$/K and not higher than $12 \times 10^{-6}$/K. As material having linear-expansion coefficient not lower than $7 \times 10^{-6}$/K and not higher than $12 \times 10^{-6}$/K, AlSiC matrix composite material, Al graphite composite material, Cu—W alloy, or Cu—Mo alloy can be used for example.

AlSiC matrix composite material is a composite of aluminum and silicon carbide, made by impregnating porous medium including mainly silicon carbide (SiC) with metal including aluminum (Al) as an ingredient, and has both a low thermal-expansion property of silicon carbide and a high thermal-conductivity of aluminum.

Al graphite composite material is made by impregnating carbonaceous member (graphite) with aluminum (Al), as similar as AlSiC matrix composite material, is material having low thermal-expansion and high thermal-conductivity.

Since carbonaceous member is made by extrusion, crystals of carbon are aligned along an extrusion direction thereof. Accordingly, aluminum is arranged in succession in the extrusion direction, so that thermal conductivity is higher in the extrusion direction. Conversely, in a direction crossing the extrusion direction, the thermal conductivity is lower since aluminum is divided by the carbonaceous member.

Cu—W alloy is material having both characteristics of tungsten (W) having low thermal-expansion property and copper (Cu) having high thermal-conductivity. Cu—Mo alloy is material in which linear-expansion coefficient and thermal-conductivity are variable in accordance with a content of molybdenum (Mo).

In the present embodiment, the heat sink 30 is made of AlSiC matrix composite material having the linear-expansion coefficient of $7 \times 10^{-6}$/K to $12 \times 10^{-6}$/K into a flat-plate shape. This AlSiC matrix composite material is made by impregnating porous medium of silicon carbide (SiC) with aluminum alloy including Si in a range not lower than 6 mass % and not higher than 12 mass % and forming a coating layer of the aluminum alloy on a surface of the porous medium.

A manufacturing method of the power-module substrate with heat-sink 100 in the present embodiment will be described. The process of bonding the circuit layer 12 and the metal layer 13 to the ceramic substrate 11 for forming the power-module substrate 10 is similar to the above-mentioned embodiments, so description will be omitted.

Also in the manufacturing process of the power-module substrate with heat-sink 10 of the present embodiment, the power-module substrate with heat-sink 100 is prevented from warping similar to the above-mentioned embodiments, by installing the power-module substrate 10 and the heat sink 30 on the tool 112.

In the present embodiment, the heat sink 30 and the power-module substrate 10 laminated with an Al—Si brazing foil therebetween is installed to the tool 112 similar to the above-mentioned embodiments. In this pressing state, a piled body of the heat sink 30 and the power-module substrate 10 is heated so as to braze.

The brazing is performed in vacuum atmosphere, by load of 0.3 MPa to 10 MPa, at heating temperature of 550° C. to 650° C.

Next, a bonded body of the heat sink 30 and the power-module substrate 10 is cooled to normal temperature (25° C.) in a state of being installed on the tool 112, that is to say, in a state of fixing the deformation.

At this time, the bonded body of the heat sink 30 and the power-module substrate 10 is pressed in the thickness direction by the tool 112 and fixed in the deformed state in which the bonded surface 30a of the heat sink 30 concavely warps. Accordingly, a shape of the bonded body does not appear to be changed even while heating and cooling. However, as a result of pressing and fixing against the deformation of members by difference of thermal-expansion along with temperature variation, plastic deformation is generated in the metal layer 13 and the heat sink 30. That is to say, the metal layer 13 and the heat sink 30 are bonded in a state of being deformed. Furthermore, since it is fixed when being cooled, the deformed state is maintained.

The power-module substrate with heat-sink 100 of the present embodiment manufactured by the similar process to the above-mentioned embodiments as above is prevented from warping since the heat sink 30 is made of material having lower linear-expansion coefficient than that of the metal layer 13. The ratio Z/L of the maximum length "L" and the warp amount "Z" of the power-module substrate with heat-sink 100 is not smaller than −0.002 and not larger than 0.002 at 25° C. Furthermore, the ratio Z/L is not smaller than −0.002 and not larger than 0.002 when heating to 280° C. and then cooling to 25° C.

If the ratio Z/L is smaller than −0.002 or larger than 0.002 at the above temperature, positions of solder and the semiconductor device are easily shifted in a soldering process of soldering the electronic component 20 such as the semiconductor device on the circuit layer 12. Moreover, it is liable to break the semiconductor device and bring deterioration of reliability of the solder-bonded part and the substrate because of the heat cycle.

If the ratio Z/L is in the range not smaller than −0.002 and not larger than 0.002 at the above temperature, the power-module substrate with heat-sink 100 is prevented from warping in manufacturing, so that warp deformation of the power module in the heat-treatment process after manufacturing is prevented. Accordingly, it is possible to improve working property in the soldering process of the electronic component 20 such as the semiconductor device and the like and reliability of the substrate against the heat-cycle load.

As described above, according to the manufacturing method of the present embodiment, forming the heat sink 30 from material having low thermal-expansion, when the heat sink 30 and the power-module substrate 10 are bonded, making the laminated body of the heat sink 30 and the power-module substrate 10 to a warped state in which an opposite side to the heat sink 30 is upper and concave in the laminating direction (a state in which the bonded surface 30a of the heat sink 30 and the surface of the circuit layer 12 are concave), holding the laminated body for a prescribed time at temperature higher than melting the brazing material (in a bonding-temperature area of the brazing material) and then cooling it so as to solidify the brazing material in the concavely warped state: the bonded body concavely warps in a state in which the circuit layer 12 is upper or slightly convexly warps even after releasing the pressing state along the thickness direction (i.e., the laminating direction). Therefore, in the bonding-temperature area of the brazing material, it is possible to generate the concave deformation in a state in which the members are expanded at the maximum. That is to say, even when the cooler is installed or even in the heat-treatment process of soldering the semiconductor device and the like after manufacturing, the power-module substrate with heat-sink 100 can be obtained in the state of the bonded surface 30a is maintained to be concave (i.e., the circuit surface is concave).

In addition, in the power-module substrate with heat-sink of the present embodiment, the warp amount changes linearly in temperature area of 25° C. to 280° C.

In the power-module substrate with heat-sink 100 as manufactured above: the warp deformation generated in manufacturing can be reduced; the warp deformation in the heat-treatment process after manufacturing can be reduced; the working property in the soldering process of the semiconductor device can be improved; and the substrate reliability against the heat-cycle load can be improved. Accordingly, it is possible to structure more freely and reduce the whole size of the power module.

In addition, in the power-module substrate with heat-sink of the present embodiment, since the metal layer 13 is made of aluminum of 99% or higher purity having relatively low deformation resistance, it is possible to reduce thermal stress in a ceramic substrate generated by heat-cycle load, so that the ceramic substrate is prevented from breaking.

Effect of reducing stress by the small deformation resistance of the metal layer 13 is further improved because the heat sink 30 is made of material of low thermal-expansion coefficient having the linear-expansion coefficient not lower than $7 \times 10^{-6}$/K and not higher than $12 \times 10^{-6}$/K.

Although a case in which the heat sink 30 is made of AlSiC matrix composite material is described in the present embodiment, the material of the heat sink 30 is not limited to it.

By using aluminum matrix composite material such as Al graphite matrix composite material, alloy material such as Cu—W alloy, Cu—Mo alloy or the like having linear-expansion coefficient not lower than $7 \times 10^{-6}$/K and not higher than $12 \times 10^{-6}$/K, as similar as in a case in which the AlSiC matrix composite material is used, the warp generated while manufacturing the power-module substrate with heat-sink is reduced, and the warp in the heat-treatment process can be prevented. Moreover, forming the heat sink 30 from material of low thermal-expansion and high thermal-conductivity, it is possible to buffer the thermal stress and obtain excellent heat-radiation property.

The heat sink and the power-module substrate of Al graphite matrix composite material can be bonded by brazing as similar as AlSiC composite material. In a case in which the heat sink is made of copper alloy such as Cu—W alloy, Cu—Mo alloy or the like, it is possible to bond by solid-phase diffusion-welding by heating at temperature lower than eutectic temperature of copper and aluminum so as to mutually diffuse copper forming the heat sink and aluminum forming the metal layer.

Examples

Effects of the above-mentioned embodiments of the aspects according to the present invention were confirmed. First, with respect to the first embodiment of the first aspect of the present invention, Examples 1 to 7 and Comparative Examples 1 to 5 will be described.

In the above-mentioned manufacturing method of the power-module substrate with heat-sink, modifying pressing loads in the piling direction of the power-module substrate and the heat sink, samples of the power-module substrate with heat-sink in which the power-module substrate and the heat-sink were bonded were manufactured. Bonding conditions of the samples are shown in Table 1 and Table 2. In the Examples 1 to 7 and the Comparative Examples 3 to 5, the pressing plates shown in Table 1 and Table 2 having radius curvatures "R" of convex and concave surfaces were used for bonding: and the flat pressing plates were used for bonding in the Comparative Examples 1 and 2.

The power-module substrates 10 in which a circuit layer 12 made of 4N-Al of 68 mm×68 mm, thickness 0.6 mm and a metal layer 13 made of materials of 68 mm×68 mm, thickness 2.1 mm shown in Table 1 were bonded to the ceramic substrate 11 made of AlN of 70 mm×70 mm, thickness 0.635 mm by the Al—Si brazing material were used for forming the power-module substrates with heat-sink of the Examples 1 to 7 and the Comparative Examples 1 to 5. Square plates of 80 mm×80 mm, thickness 5 mm were used for the heat sinks 30 of the Examples 1 to 7 and the Comparative Examples 1 to 5, made of materials shown in Table 1 and Table 2.

With respect to the samples of these power-module substrates with heat-sink, evaluations were performed about "the ratio Z/L of the maximum length L and the warp amount Z of the heat sink at temperatures", "difference ΔZ/L between a maximum value and a minimum value of the ratio Z/L along with temperature variation", "position shift of soldering", "position shift of element" and "breakage of element".

With respect to the warp amount "Z" of the heat sinks, flatness values at a back surface of the heat sink were regarded as the warp amount "Z", measured by using a moire-type three-dimensional shape measuring device at: a point in time of 25° C. (normal temperature), a point in time of heated to 280° C., and a point in time of cooled to 25° C. (25° C. cooled) after heated to 280° C. The warp amount "Z" was positive value if deformation in which the heat sink 30 side was convex and the circuit layer 12 side was concave.

The position shift of soldering was confirmed by: disposing solder (Sn—Ag—Cu matrix, melting point about 220° C.) on the circuit layers 12 of the samples, heating to temperature just below the melting point of the solder (200° C.), and checking changes of positions of the solder. 30 samples were manufactured for the respective Examples and Comparative Examples. It was evaluated as "NG" if the position shift was not smaller than 0.2 mm; or evaluated as "OK" if the position shift was smaller than 0.2 mm. In Table 1 and Table 2, it is denoted by "A" if a rate of "OK" was 100%; "B" if the rate of "OK" was 90% or higher; and "C" if the rate of "OK" was lower than 90%.

The position shift of element was confirmed by measuring soldered position of the element after soldering the element on the circuit layer 12 whether the position shift was occurred or not. It was evaluated as "NG" if the position shift was not smaller than 0.2 mm; or evaluated as "OK" if the position shift was smaller than 0.2 mm. In Table 1 and Table 2, it is denoted by "A" if a rate of "OK" was 100%; "B" if the rate of "OK" was 90% or higher; and "C" if the rate of "OK" was lower than 90%.

An element break was confirmed whether the element worked normally (OK) or not (NG) after soldering the element on the circuit layer and wiring it. In Table 1 and Table 2, it is denoted by "A" if a rate of "OK" was 100%/o; "B" if the rate of "OK" was 90% or higher; and "C" if the rate of "OK" was lower than 90%.

TABLE 1

| | | EXAMPLE 1 | EXAMPLE 2 | EXAMPLE 3 | EXAMPLE 4 | EXAMPLE 5 | EXAMPLE 6 | EXAMPLE 7 |
|---|---|---|---|---|---|---|---|---|
| | | SAMPLES | | | | | | |
| MATERIAL OF METAL LAYER | | 4N | 4N | 4N | 4N | 2N | 4N | 4N |
| MATERIAL OF HEAT SINK | | A6063 | A6063 | A6063 | A6063 | A6063 | A3003 | A6063 |
| RADIUS CURVATURE OF PRESSING PLATE R (mm) | | 3000 | 3000 | 3000 | 1000 | 3000 | 3000 | 6000 |
| PRSSING LOAD (MPa) | | 0.3 | 0.5 | 0.2 | 0.2 | 0.3 | 0.3 | 0.5 |
| RATIO Z/L | 25° C. | 0.002 | 0.001 | 0.005 | −0.001 | 0.003 | 0.002 | 0.005 |
| | 280° C. | −0.002 | −0.004 | 0 | −0.005 | −0.001 | −0.003 | −0.001 |
| | 25° C. (again) | 0.002 | 0.001 | 0.005 | −0.001 | 0.003 | 0.002 | 0.005 |
| ΔZ/L | | 0.004 | 0.005 | 0.005 | 0.004 | 0.004 | 0.005 | 0.006 |
| POSITION SHIFT OF SOLDERING | | A | A | A | A | A | A | A |
| POSITION SHIFT OF ELEMENT | | A | A | A | A | A | A | B |
| ELEMENT BREAK | | A | A | A | A | A | A | A |

TABLE 2

|  |  | COMPARATIVE EXAMPLE 1 | COMPARATIVE EXAMPLE 2 | COMPARATIVE EXAMPLE 3 | COMPARATIVE EXAMPLE 4 | COMPARATIVE EXAMPLE 5 |
|---|---|---|---|---|---|---|
| MATERIAL OF METAL LAYER | | 4N | 4N | 4N | 4N | 2N |
| MATERIAL OF HEAT SINK | | A6063 | A6063 | A6063 | A6063 | 4N |
| RADIUS CURVATURE OF PRESSING PLATE R (mm) | | FLAT PLATE | FLAT PLATE | 8000 | 1000 | 1000 |
| PRSSING LOAD (MPa) | | 0 | 0.3 | 0.3 | 0.3 | 0.3 |
| RATIO Z/L | 25° C. | 0.014 | 0.006 | 0.006 | −0.002 | −0.007 |
| | 280° C. | 0.008 | −0.001 | 0.001 | −0.006 | −0.001 |
| | 25° C. (again) | 0.014 | 0.006 | 0.006 | −0.002 | −0.007 |
| ΔZ/L | | 0.006 | 0.007 | 0.005 | 0.004 | 0.006 |
| POSITION SHIFT OF SOLDERING | | C | C | C | A | C |
| POSITION SHIFT OF ELEMENT | | C | C | A | A | C |
| ELEMENT BREAK | | A | A | A | C | A |

As known from Table 1, in the samples of the Examples 1 to 6: the ratio Z/L was not smaller than −0.005 and not larger than 0.005 at 25° C., the ratio Z/L was not smaller than −0.005 and not larger than 0.005 when heated to 280° C., and the ratio Z/L was not smaller than −0.005 and not larger than 0005 when cooled to 25° C. after the heating; good results were obtained in evaluations of "position shift of soldering", "position shift of element", and "element break".

In Example 7, the ratio Z/L being not smaller than −0.005 and not larger than 0.005 at the temperatures; nevertheless the difference ΔZ/L between the maximum value and the minimum value of the ratio Z/L was 0.006: the evaluations of "position shift of soldering" and "element break" were good, but a small number of the position shift of element were occurred.

In the Comparative Example 1 in which the pressing load was small, the ratio Z/L is was out of the range not smaller than −0.005 and not larger than 0.005, at 25° C., 280° C., and when cooled to 25° C. (Table 2).

In the Comparative Example 2 using the flat plate and in the Comparative Example 3 in which the radius curvature R of the pressing plate was 8000 mm: the ratio Z/L at 25° C. was out of the range not smaller than −0.005 and not larger than 0.005; and a number of the position shifts of soldering were occurred (Table 2). Furthermore, in the Comparative Example 4 in which the ratio Z/L at 280° C. was out of the range not smaller than −0.005 and not larger than 0.005, a number of the element breaks were occurred (Table 2).

Next, Examples 2.1 to 2.7 and Comparative Examples 2.1 to 2.2 performed in order to confirm the effect of the second embodiment according to the second aspect of the present invention will be described.

In the above-mentioned manufacturing process of the power-module substrate with heat-sink, a plurality of samples of the power-module substrate with heat-sink were manufactured by bonding power-module substrates and heat sinks with altering the pressing load in the piling direction of the power-module substrate and the heat sink. Bonding conditions of the samples were shown in Table 3 and Table 4. The bonding process of the Examples 2.1 to 2.7 and the Comparative Example 2.2 was performed using the pressing plate having the radius curvature R at the concave and convex surfaces shown in Table 3 and Table 4. In the Comparative Example 2.1, the bonding process was performed by using the flat-shape pressing plate.

The power-module substrates 10 in which a circuit layer 12 made of 4N-Al of 68 mm×28 mm, thickness 0.4 mm and a metal layer 13 made of materials of 68 mm×22 mm, thickness 0.4 mm shown in Table 3 and Table 4 were bonded to the ceramic substrate 11 made of AlN of 70 mm×30 mm, thickness 0.635 mm by the Al—Si brazing material were used for forming the power-module substrates with heat-sink of the Examples 2.1 to 2.7 and the Comparative Examples 2.1 to 2.2. Square plates of 100 mm×40 mm, thickness 3 mm were used for the heat sinks 30 of the Examples 2.1 to 2.7 and the Comparative Examples 2.1 to 2.2, made of materials shown in Table 3 and Table 4.

With respect to these samples of the power-module substrates with heat-sink, evaluations were performed about "the ratio Z/L of the maximum length L and the warp amount Z of the heat sink at temperatures", "difference ΔZ/L between a maximum value and a minimum value of the ratio Z/L along with temperature variation", "position shift of soldering", "position shift of element" and "breakage of element". Evaluation was performed similarly to the Examples 1 to 7 and the Comparative Examples 1 to 5 shown in Table 1 and Table 2. In Table 3 and Table 4, it is denoted by "A" if a rate of "OK" was 90% or higher; and "C" if the rate of "OK" was lower than 90%.

TABLE 3

|  | EXAMPLE 2.1 | EXAMPLE 2.2 | EXAMPLE 2.3 | EXAMPLE 2.4 | EXAMPLE 2.5 | EXAMPLE 2.6 | EXAMPLE 2.7 |
|---|---|---|---|---|---|---|---|
| MATERIAL OF METAL LAYER | 4N—Al | 4N—Al | 4N—Al | 4N—Al | 2N—Al | 4N—Al | 4N—Al |
| MATERIAL OF HEAT SINK | C1020 | C1020 | C1020 | C1020 | C1020 | C1020 | C2200 |

TABLE 3-continued

| | SAMPLES | | | | | | |
|---|---|---|---|---|---|---|---|
| | EXAMPLE 2.1 | EXAMPLE 2.2 | EXAMPLE 2.3 | EXAMPLE 2.4 | EXAMPLE 2.5 | EXAMPLE 2.6 | EXAMPLE 2.7 |
| LINEAR-EXPANSION COEFFICIENT OF HEAT SINK (×10$^{-6}$/K) | 17 | 17 | 17 | 17 | 17 | 17 | 20 |
| RADIUS CURVATURE OF PRESSING PLATE R (mm) | 3000 | 3000 | 1000 | 6000 | 3000 | 3000 | 3000 |
| PRSSING LOAD (MPa) | 1.0 | 0.5 | 1.0 | 1.0 | 1.0 | 0.05 | 1.0 |
| RATIO Z/L 25° C. | −0.004 | −0.003 | −0.005 | −0.002 | −0.005 | 0.008 | −0.005 |
| 280° C. (heated) | −0.014 | −0.013 | −0.015 | −0.012 | −0.033 | −0.002 | −0.013 |
| 25° C. (cooled) | −0.004 | −0.003 | −0.005 | −0.002 | −0.005 | 0.008 | −0.005 |
| ΔZ/L | 0.010 | 0.010 | 0.010 | 0.010 | 0.008 | 0.010 | 0.008 |
| POSITION SHIFT OF SOLDERING | A | A | A | A | A | A | A |
| POSITION SHIFT OF ELEMENT | A | A | A | A | A | A | A |
| ELEMENT BREAK | A | A | A | A | A | A | A |

TABLE 4

| | SAMPLES | |
|---|---|---|
| | COMPARATIVE EXAMPLE 2.1 | COMPARATIVE EXAMPLE 2.2 |
| MATERIAL OF METAL LAYER | 4N—Al | 4N—Al |
| MATERIAL OF HEAT SINK | C1020 | C1020 |
| LINEAR-EXPANSION COEFFICIENT OF HEAT SINK (×1.0$^{-6}$/K) | 17 | 17 |
| RADIUS CURVATURE OF PRESSING PLATE R (mm) | FLAT PLATE | 500 |
| PRSSING LOAD (MPa) | 0 | 1.0 |
| RATIO Z/L 25° C. | 0.011 | −0.006 |
| 280° C. (heated) | −0.007 | −0.016 |
| 25° C. (cooled) | 0.011 | −0.006 |
| ΔZ/L | 0.018 | 0.010 |
| POSITION SHIFT OF SOLDERING | C | A |
| POSITION SHIFT OF ELEMENT | C | A |
| ELEMENT BREAK | A | C |

As known from Table 3, in the samples of the Examples 2.1 to 2.7: the ratio Z/L was not smaller than −0.015 and not larger than 0.01 at 25° C., the ratio Z/L was not smaller than −0.015 and not larger than 0.01 when heated to 280° C., and the ratio Z/L was not smaller than −0.015 and not larger than 001 when cooled to 25° C. after the heating; good results were obtained in evaluations of "position shift of soldering", "position shift of element", and "element break".

In the Comparative Example 2.1 in which the pressing load was 0 MPa, the ratios Z/L at 25° C. and cooled to 25° C. (again) were out of the range of not smaller than −0.015 and not larger than 0.1 (Table 4).

In the Comparative Example 2.2 in which the radius curvature R of the pressing plate was 500 mm, the ratio Z/L was out of the range not smaller than −0.015 and not larger than 0.01 at 25° C.; the position shift of element and the element break were occurred (Table 4).

Next, Examples 3.1 to 3.10 and Comparative Examples 3.1 to 3.5 performed in order to confirm the effect of the third embodiment according to the third aspect of the present invention will be described.

In the above-mentioned manufacturing process of the power-module substrate with heat-sink, a plurality of samples of the power-module substrate with heat-sink were manufactured by bonding power-module substrates and heat sinks with altering the pressing load in the piling direction of the power-module substrate and the heat sink. Bonding conditions of the samples are shown in Table 5 and Table 6. The bonding processes of the Examples 3.1 to 3.10 and the Comparative Examples 3.3 to 3.5 were performed using the pressing plate having the radius curvature R at the concave and convex surfaces shown in Table 5 and Table 6. In the Comparative Examples 3.1 and 3.2, the bonding processes were performed by using the flat-shape pressing plate.

The power-module substrates 10 in which a circuit layer 12 made of 4N-Al of 138 mm×68 mm, thickness 0.6 mm and a metal layer 13 made of materials of 138 mm×68 mm, thickness 2.1 mm shown in Table 5 and Table 6 were bonded to the ceramic substrate 11 made of AlN of 140 mm×70 mm, thickness 0.635 mm by the Al—Si brazing material were used for forming the power-module substrates with heat-sink of the Examples 3.1 to 3.10 and the Comparative Examples 3.1 to 3.5. Square plates of 170 mm×100 mm, thickness 5 mm were used for the heat sinks 30 of the Examples 3.1 to 3.10 and the Comparative Examples 3.1 to 3.5, made of materials shown in Table 5 and Table 6.

With respect to these samples of the power-module substrates with heat-sink, evaluations were performed about "the ratio Z/L of the maximum length L and the warp amount Z of the heat sink at temperatures", "difference ΔZ/L between a maximum value and a minimum value of the ratio Z/L along with temperature variation", "position shift of soldering", "position shift of element" and "breakage of element". Evaluation was performed similarly to the Examples 1 to 7 and the Comparative Examples 1 to 5 shown in Table 1 and Table 2, and the Examples 2.1 to 2.7 and the Comparative Examples 2.1 to 2.2 shown in Table 3 and Table 4.

The position shift of soldering was confirmed by: disposing solder (Sn—Ag—Cu matrix, melting point about 220° C.) on the circuit layers 12 of the samples, heating to temperature just below the melting point of the solder (200° C.), and checking changes of positions of the solder. 30 samples were manufactured for the respective Examples and Comparative Examples. It was evaluated as "NG" if the position shift was not smaller than 0.2 mm, or evaluated as "OK" if the position shift was smaller than 0.2 mm. In Table 5 and Table 6, it is denoted by "A" if a rate of "OK" was 100%; "B" if the rate of "OK" was 90% or higher; and "C" if the rate of "OK" was lower than 90%.

The position shift of element was confirmed by manufacturing 30 samples and measuring soldered position of the element after soldering the element on the circuit layer 12 whether the position shift was occurred or not. It was evaluated as "NG" if the position shift was not smaller than 0.2 mm; or evaluated as "OK" if the position shift was smaller than 0.2 mm. In Table 5 and Table 6, it is denoted by "A" if a rate of "OK" was 100%; "B" if the rate of "OK" was 90% or higher; and "C" if the rate of "OK" was lower than 90%.

With respect to 30 samples made by soldering and wiring elements on the circuit layers 12, an element break was evaluated as "OK" if the element behaved properly; or as "NG" if the element did not behave properly. Results are shown in Table 5 and Table 6. In Table 5 and Table 6: it is denoted by "A" if a rate of "OK" was 100%; "B" if the rate of "OK" was 90% or higher; and "C" if the rate of "OK" was lower than 90%.

TABLE 5

| | SAMPLES | | | | | | | | | |
|---|---|---|---|---|---|---|---|---|---|---|
| | EXAMPLE 3.1 | EXAMPLE 3.2 | EXAMPLE 3.3 | EXAMPLE 3.4 | EXAMPLE 3.5 | EXAMPLE 3.6 | EXAMPLE 3.7 | EXAMPLE 3.8 | EXAMPLE 3.9 | EXAMPLE 3.10 |
| MATERIAL OF METAL LAYER | 4N—Al | 4N—Al | 4N—Al | 4N—Al | 2N—Al | 4N—Al | 4N—Al | 4N—Al | 4N—Al | 4N—Al |
| MATERIAL OF HEAT SINK | AlSiC | AlSiC | AlSiC | AlSiC | AlSiC | AlSiC | AlSiC | Cu—W | Cu—Mo | AlSiC |
| RADIUS CURVATURE OF PRESSING PLATE R (mm) | 3000 | 3000 | 3000 | 1000 | 3000 | 6000 | 1000 | 3000 | 3000 | 1000 |
| LINEAR-EXPANSION COEFFICIENT OF HEAT SINK ($\times 10^{-6}$/K) | 8.0 | 8.0 | 8.0 | 8.0 | 8.0 | 8.0 | 7.0 | 8.0 | 8.0 | 12.0 |
| PRSSING LOAD (MPa) | 0.3 | 0.5 | 0.2 | 0.2 | 0.3 | 0.5 | 0.3 | 0.3 | 0.3 | 0.3 |
| RATIO Z/L 25° C. | 0.001 | 0 | 0.002 | −0.001 | 0.002 | 0.002 | −0.002 | 0.002 | 0.002 | 0 |
| 280° C. | 0 | −0.001 | 0.001 | −0.002 | 0 | 0 | −0.002 | 0 | 0 | −0.002 |
| 25° C. (cooled) | 0.001 | 0 | 0.002 | −0.001 | 0.002 | 0.002 | −0.002 | 0.002 | 0.002 | 0 |
| ΔZ/L | 0.001 | 0.001 | 0.001 | 0.001 | 0.002 | 0.002 | 0 | 0.002 | 0.002 | 0.002 |
| POSITION SHIFT OF SOLDERING | A | A | A | A | A | A | A | A | A | A |
| POSITION SHIFT OF ELEMENT | A | A | A | A | A | B | A | A | A | B |
| ELEMENT BREAK | A | A | A | A | A | A | A | A | A | A |

TABLE 6

| | SAMPLES | | | | |
|---|---|---|---|---|---|
| | COMPARATIVE EXAMPLE 3.1 | COMPARATIVE EXAMPLE 3.2 | COMPARATIVE EXAMPLE 3.3 | COMPARATIVE EXAMPLE 3.4 | COMPARATIVE EXAMPLE 3.5 |
| MATERIAL OF METAL LAYER | 4N—Al | 4N—Al | 4N—Al | 4N—Al | 4N—Al |
| MATERIAL OF HEAT SINK | AlSiC | AlSiC | AlSiC | AlSiC | Cu—W |
| RADIUS CURVATURE OF PRESSING PLATE R (mm) | FLAT PLATE | FLAT PLATE | 7000 | 900 | 1000 |
| LINEAR-EXPANSION COEFFICIENT OF HEAT SINK ($\times 10^{-6}$/K) | 8.0 | 8.0 | 8.0 | 8.0 | 6.0 |
| PRSSING LOAD (MPa) | 0 | 0.3 | 0.3 | 0.3 | 0.3 |
| RATIO Z/L 25° C. | 0.009 | 0.005 | 0.004 | −0.002 | −0.003 |
| 280° C. | 0.006 | 0.002 | 0.002 | −0.003 | −0.002 |
| 25° C. (cooled) | 0.009 | 0.005 | 0.004 | −0.002 | −0.003 |
| ΔZ/L | 0.003 | 0.003 | 0.002 | 0.002 | −0.001 |
| POSITION SHIFT OF SOLDERING | C | C | C | A | C |
| POSITION SHIFT OF ELEMENT | C | C | A | A | A |
| ELEMENT BREAK | A | A | A | C | A |

As known from Table 5, in the samples of the Examples 3.1 to 3.10: the ratio Z/L was not smaller than −0.002 and not larger than 0.002 at 25° C., the ratio Z/L was not smaller than −0.002 and not larger than 0.002 when heated to 280° C., and the ratio Z/L was not smaller than −0.002 and not larger than 0002 when cooled to 25° C. after the heating; good results were obtained in evaluations of "position shift of soldering", "position shift of element", and "element break".

In Comparative Example 3.1 in which the pressing load is 0 MPa, the ratio Z/L was out of the range not smaller than −0.002 and not larger than 0.002 at 25° C., 280° C. and cooled to 25° C. (Table 6).

In the Comparative Example 3.2 using the flat plate and in the Comparative Example 3.3 in which the radius curvature R of the pressing plate was 7000 mm: the ratio Z/L at 25° C. was out of the range not smaller than −0.002 and not larger than 0.002; and a number of the position shifts of soldering were occurred (Table 6). Furthermore, in the Comparative Example 3.4 in which the ratio Z/L at 280° C. was out of the range not smaller than −0.002 and not larger than 0.002, a number of the element breaks were occurred (Table 6). In Comparative Example 3.5 in which the ratios Z/L at 25° C. and cooled to 25° C. were out of the range not smaller than −0.002 and not larger than 0.002, a number of the position shifting of soldering were occurred (Table 6).

As described above, in the power-module substrate with heat-sink 100 according the present invention: the warp deformation occurred in manufacturing can be reduced; and the warp deformation in the heat-treatment process after manufacturing can be reduced. Accordingly, it is possible to improve the work-property in the soldering process of elements and the substrate reliability against the heat-cycle load.

In addition, since the warp is generally generated three-dimensionally, the maximum length "L" of the square plate is a length of a diagonal line. The warp amount "Z" is a difference between a maximum value and a minimum value along the thickness direction at a portion included in the maximum length "L".

The present invention is not limited to the above-described embodiments and various modifications may be made for particulars without departing from the scope of the present invention.

For example, though the metal layer of the power-module substrate and the heat sink are bonded by brazing in the above embodiment, not only brazing but also soldering, diffusion-welding or the like are applicable for bonding.

Moreover, Transient Liquid Phase Diffusion Bonding (a TLP bonding method) can be used for bonding the ceramic substrate to the circuit layer, the ceramic substrate to the metal layer, and the metal layer to the heat sink.

This transient liquid phase diffusion bonding is performed in a state in which a copper layer deposited on a surface of the circuit layer or the metal layer is left on an interface between the ceramic substrate and the circuit layer or the metal layer, or an interface between the metal layer and the heat sink. Copper is diffused into the circuit layer or the metal layer and aluminum by heating, copper concentration in the circuit layer or the metal layer is increased in the vicinity of the copper layer so that the melting point is lowered, so that a metal liquid phase is formed at the bonding interface in eutectic area of aluminum and copper. By fixing temperature in a state in which the metal liquid phase is formed, the metal liquid phase reacts to the ceramic substrate or the heat sink; and copper is further diffused into aluminum, so that the melting point is heighten since the copper concentration in the metal liquid phase is gradually decreased, so that solidification is progressed while fixing temperature. Accordingly, it is possible to firmly bond the circuit layer or the metal layer to the ceramic substrate, or the metal layer to the heat sink.

Moreover, though the heat sink and the power-module substrate are bonded by the Al—Si brazing material in the above embodiments, Al—Si—Mg brazing material can be used for bonding in a case in which the heat sink is made of AlSiC matrix composite material or Al graphite composite material. In this case, it is not necessary to bond in vacuum atmosphere and the brazing can be performed under inert atmosphere such as nitrogenous; so it is easy to bond the heat sink to the power-module substrate.

INDUSTRIAL APPLICABILITY

A warp generated in manufacturing a power-module substrate with heat-sink is reduced and a warp in a heat-treatment process after manufacturing is reduced.

REFERENCE SIGNS LIST

10 power-module substrate
11 ceramic substrate
12 circuit layer
13 metal layer
20 electronic component
21 solder-bonding layer
30 heat sink
30$a$ bonded surface
100 power-module substrate with heat-sink
110 pressing plate
110$a$ concave surface
110$b$ convex surface
111 post
112 tool
113 nut
114 top plate
115 pressing device
P power module

The invention claimed is:
1. A manufacturing method of a power-module substrate with heat sink,
wherein the power-module substrate including a ceramic substrate, a circuit layer provided on one surface of the ceramic substrate, and a metal layer made of aluminum of purity not lower than 99% provided on another surface of the ceramic substrate; and
a heat sink made of material having linear-expansion coefficient of not smaller than $7\times10^{-6}$/K and not larger than $12\times10^{-6}$/K and bonded on the metal layer of the power-module substrate, wherein
a maximum length of the heat sink is set as "L" and a warp amount of the heat sink is set as "Z";
the warp amount "Z" is set as a positive value if a bonded surface of the heat sink on the metal layer is deformed to be concave; or is set as a negative value if the bonded surface is deformed to be convex;
a ratio Z/L of the maximum length "L" and the warp amount "Z" measured at 25° C. is in a range not smaller than −0.002 and not larger than 0.002, and
the ratio Z/L is in the range not smaller than −0.002 and not larger than 0.002 even when it is heated to 280° C. and then cooled to 25° C.;

the method comprising:

laminating the power-module substrate and the heat sink;

placing the power module substrate with heat sink between a first pressing plate and a second pressing plate; each pressing plate having a curved fixture radius of at least 1000 mm and no greater than 6000 mm;

brazing the power module substrate by heating in a vacuum atmosphere at a temperature of 550° C. to 650° C. in which the bonded surface of the heat sink is deformed by a load of 0.3 MPa to 10 MPa by the first pressing plate and second pressing plate to concavely warp; and cooling in a deformed state to substantially 25° C. so as to bond power-module substrate and the heat sink.

2. A manufacturing method according to claim 1, wherein the heat sink is made from AlSiC matrix composite material, Al graphite composite material, Cu—W alloy, or Cu—Mo alloy.

3. A manufacturing method according to claim 1, wherein a difference $\Delta Z/L$ between a maximum value and a minimum value of the ratio $Z/L$ when the temperature is varied from 25° C. to 280° C. is not larger than 0.002.

* * * * *